US 6,599,134 B1

(12) United States Patent
Duarte et al.

(10) Patent No.: US 6,599,134 B1
(45) Date of Patent: Jul. 29, 2003

(54) TRANSVERSE BACKPLANE

(76) Inventors: Frank Duarte, 511 4th St., B7, Ramona, CA (US) 92065; Frank Davis, 6260 Sequence Dr., Suite A, San Diego, CA (US) 92121

(*) Notice: Subject to any disclaimer, the term of this patent is extended or adjusted under 35 U.S.C. 154(b) by 0 days.

(21) Appl. No.: 09/875,307

(22) Filed: Jun. 4, 2001

Related U.S. Application Data
(60) Provisional application No. 60/209,138, filed on Jun. 2, 2000.

(51) Int. Cl.[7] ............................................... H01R 11/09
(52) U.S. Cl. ......................................... 439/61; 361/796
(58) Field of Search ............................... 439/61, 74, 75; 361/788, 796

(56) References Cited

U.S. PATENT DOCUMENTS

| | | | | | |
|---|---|---|---|---|---|
| 4,979,075 A | * | 12/1990 | Murphy | ...................... | 361/399 |
| 5,038,308 A | * | 8/1991 | Le et al. | ...................... | 364/708 |
| 5,896,473 A | * | 4/1999 | Kaspari | ...................... | 385/24 |

* cited by examiner

Primary Examiner—Khiem Nguyen
(74) Attorney, Agent, or Firm—Thomas J. Tighe, Esq.

(57) ABSTRACT

A low profile, 1U expansion PC board for mounting at least two PCI connectors, mountable by a male-to-male connector to a PCI matrix on the transverse side of a 1U PICMG computer backplane. Additional mechanical security is provided by mounting stanchions between the board and the backplane.

4 Claims, 2 Drawing Sheets

TRANSVERSE BACKPLANE

This invention claims the benefit of provisional application filed Jun. 2, 2000, Ser. No. 60/209,138, by same applicants herein.

BACKGROUND OF THE INVENTION

This invention relates to industrial and mission critical computers housed in a 1U chassis (1.75" outer diameter), and in particular to a novel expansion of the PCI bus for a 1U backplane.

There currently exists a need for computers having such an extremely short profile. A computer having a 1U chassis conventionally has a vertical computer backplane only about 1.7 inches high. Conventionally there is a PICMG CPU card or a motherboard plugged horizontally into the vertical backplane leaving only room for one I/O connector, such as a PCI connector above it. So basically there is a very short backplane with two cards plugged horizontally into it with no room for an additional PCI connector or card. Moreover, the PCI card that is plugged parallel to the CPU card cannot be a full size card because current processors on the CPU card have a high profile due to a heat sink and fan.

There has been a long felt need to provide one or more PCI expansion slots for such a low profile chassis, slots which can accommodate an off-the-shelf sized PCI card.

Other advantages and attributes of this invention will be readily discernable upon a reading of the text hereinafter.

DESCRIPTION OF THE PREFERRED EMBODIMENT

Figure 1:
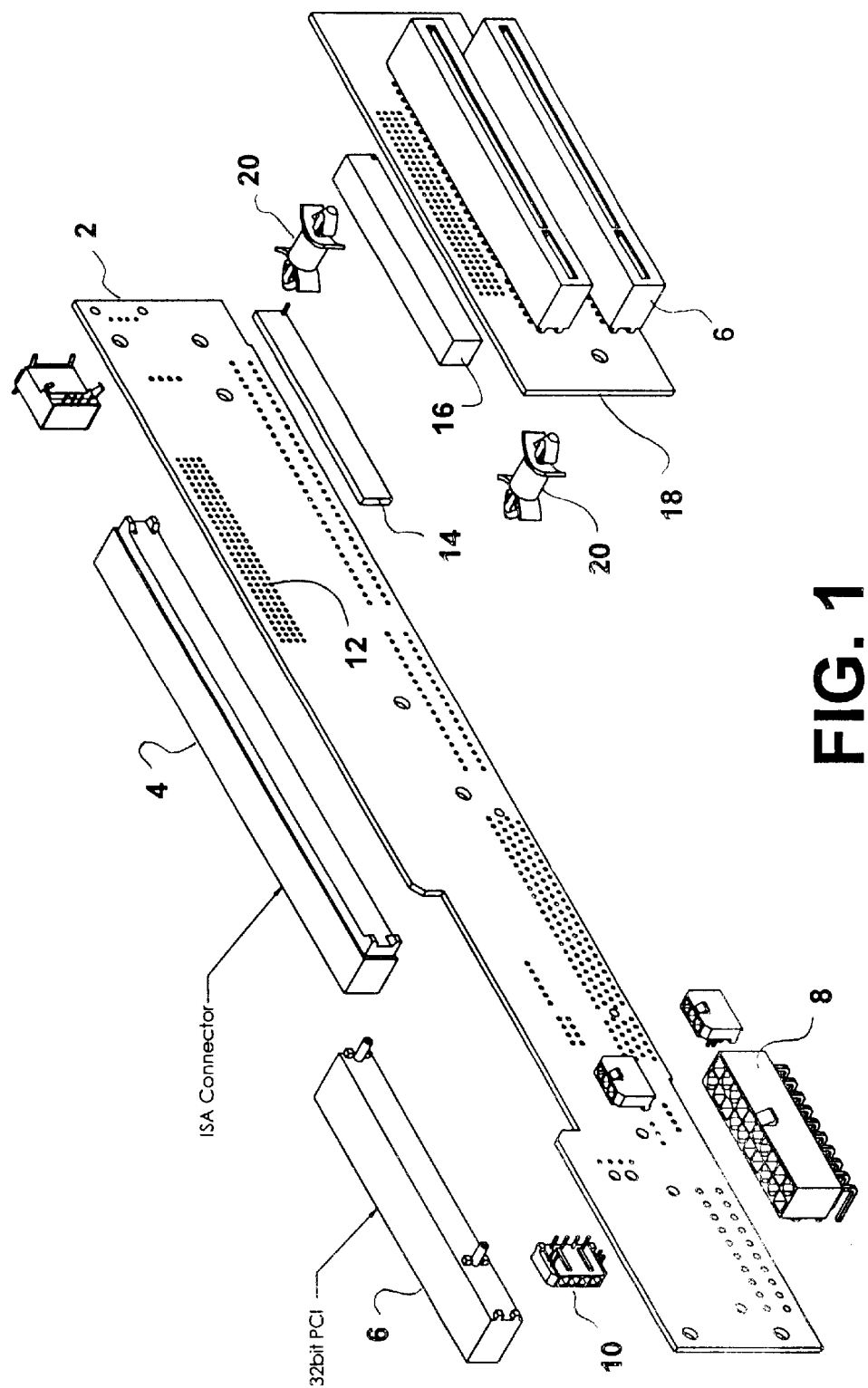
FIG. 1 is a pictorial view of a blow-up of this invention.
Figure 2:
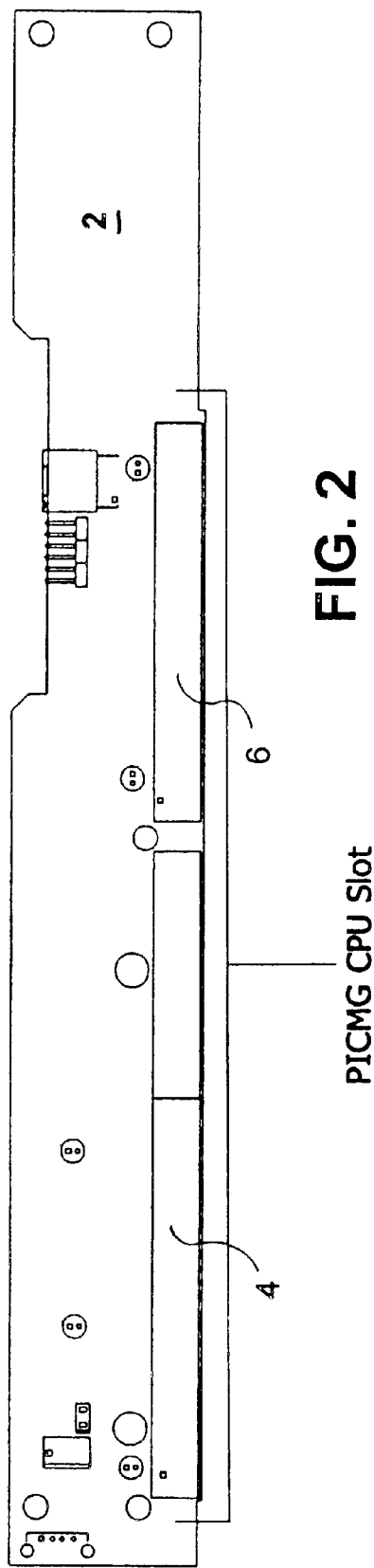
FIG. 2 is a front view of a 1U chassis according to this invention.
Figure 3:
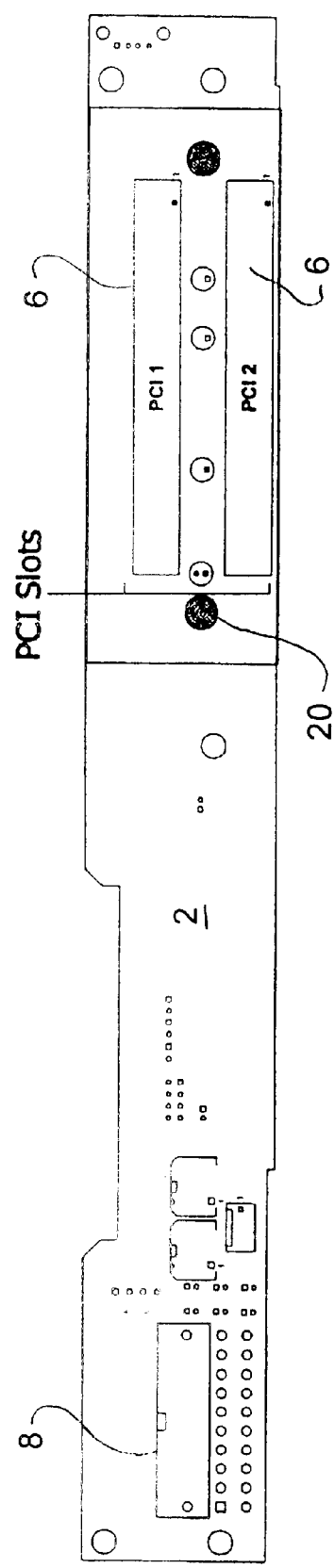
FIG. 3 is a back view of a 1U chassis according to this invention.

Referring to FIG. 1, a 1U passive backplane 2 conventionally has an ISA connector 4 and a PCI connector 6 affixed in-line on one side of the backplane which also has a power connector 8 plugged into the other side of the backplane. Various other connectors 10 also plug into the backplane. Into the in-line ISA and PCI connectors plugs a CPU card or motherboard (not shown) which is the basic computer. Near the top edge of the backplane is a matrix 12 of holes for mounting a male-to-male connector made from two conventional parts, 14 and 16 which, when joined together, form the male-to-male connector. On the side of the male-to-male connector opposite the backplane is mounted an expansion PC board 18 having basically the same height as the backplane. On the side of the PC board 18 opposite the backplane are mounted two conventional PCI connectors 6 interconnected by bus lines on the PC board. Two stanchions 20 help to mechanically secure the expansion PC board to the backplane.

Electrically, the matrix 12 communicates with the PCI bus of the computer card and communicates the PCI signals to the expansion card 18 which distributes them to the PCI connectors.

The foregoing description and drawings were given for illustrative purposes only, it being understood that the invention is not limited to the embodiments disclosed, but is intended to embrace any and all alternatives, equivalents, modifications and rearrangements of elements falling within the scope of the invention as defined by the following claims.

We claim:

1. For a PICMG computer having a 1U backplane which includes a CPU card connector and a matrix of holes for mounting a single PCI connector, a device for expanding the number of PCI connectors comprising:

(a) a circuit board having no more than a 1U profile, said board carrying PCI bus lines, (b) two PCI connectors on the board in communication with the bus lines, and (c) connection means also in communication with the bus lines for mounting the circuit board onto the 1U backplane on a side opposite the CPU card connector, wherein the board is further mechanically secured to the backplane.

2. The computer of claim 1 wherein the connection means comprises a male-to-male connector which interconnects the board with the matrix of holes in the backplane.

3. For a computer having a 1U backplane which includes a connector for coupling said backplane to a processor motherboard, the motherboard including a PCI bus, a device for expanding the number of PCI connectors communicating with the motherboard comprising:

(a) the connector between the backplane and the motherboard communicating PCI bus signals therebetween, (b) a circuit board having no more than a 1U profile, said board including signal lines for carrying PCI bus signals, (c) a plurality of PCI connectors on the circuit board in communication with the signal lines, (d) a physical connection for affixing the circuit board to the backplane on a side opposite the motherboard without extending beyond the 1U profile of the backplane, the PCI connectors on the circuit board facing away from the backplane, and (e) an electrical connection between the circuit board's signal lines and the backplane's PCI bus.

4. The device according to claim 3 wherein the electrical connection between the circuit board's signal lines and the backplane's PCI bus comprises a connector which mates with a pre-existing matrix of PCI signal via's defined by the backplane and which communicate with the backplane's PCI bus.

* * * * *